(12) United States Patent
Gütlein

(10) Patent No.: US 7,872,449 B2
(45) Date of Patent: Jan. 18, 2011

(54) INDUSTRIAL TRUCK WITH A BATTERY AND METHOD FOR OPERATING AN INDUSTRIAL TRUCK WITH A BATTERY

(75) Inventor: Ralf Gütlein, Stockstadt (DE)

(73) Assignee: Linde Material Handling GmbH, Aschaffenburg (DE)

( * ) Notice: Subject to any disclaimer, the term of this patent is extended or adjusted under 35 U.S.C. 154(b) by 677 days.

(21) Appl. No.: 11/787,102

(22) Filed: Apr. 13, 2007

(65) Prior Publication Data

US 2007/0279065 A1 Dec. 6, 2007

(30) Foreign Application Priority Data

Apr. 13, 2006 (DE) .................. 10 2006 017 889

(51) Int. Cl.
 *H02J 7/00* (2006.01)
 *G08B 21/00* (2006.01)
 *G01N 27/416* (2006.01)
 *H02P 3/00* (2006.01)

(52) U.S. Cl. .................. 320/132; 320/149; 320/104; 340/636.1; 340/636.21; 324/426; 318/139

(58) Field of Classification Search .................. 320/132, 320/149, 104
See application file for complete search history.

(56) References Cited

U.S. PATENT DOCUMENTS

| 1,362,019 | A | 12/1920 | Lubeck |
| 2,504,885 | A | 4/1950 | Schreck |
| 3,014,344 | A | 12/1961 | Arnot |
| 3,259,365 | A | 7/1966 | Gibson |
| 3,497,090 | A | 2/1970 | Daniels |
| 3,687,484 | A | 8/1972 | Cosby |
| 3,708,028 | A | 1/1973 | Hafer |
| 3,797,600 | A | 3/1974 | Miner |
| 4,026,378 | A | 5/1977 | DePriester |
| 4,042,054 | A | 8/1977 | Ward |
| 4,058,182 | A | 11/1977 | Huber |
| 4,065,012 | A | 12/1977 | Rocco |
| 4,101,038 | A | 7/1978 | Palma |
| 4,227,463 | A | 10/1980 | Pfeger |
| 4,333,149 | A | 6/1982 | Taylor et al. |
| 4,362,220 | A | 12/1982 | Baston |
| 4,397,365 | A | 8/1983 | Harbe et al. |
| 4,429,761 | A | 2/1984 | Haddock, Jr. et al. |
| 4,432,424 | A | 2/1984 | Abels et al. |
| 4,808,058 | A | 2/1989 | Carney et al. |

(Continued)

FOREIGN PATENT DOCUMENTS

DE 3839618 A1 11/1988

(Continued)

*Primary Examiner*—Edward Tso
*Assistant Examiner*—Yalkew Fantu
(74) *Attorney, Agent, or Firm*—The Webb Law Firm

(57) ABSTRACT

The invention relates to an industrial truck with at least one drive battery and at least one apparatus (A) for determining the state of charge of the battery and to a method for operating such an industrial truck. The apparatus (A) for determining the state of charge of the battery includes a device (B) for determining the dynamic internal resistance and a device (C) for determining the internal cell voltage of the battery with the aid of the dynamic internal resistance.

16 Claims, 2 Drawing Sheets

U.S. PATENT DOCUMENTS

| | | | |
|---|---|---|---|
| 5,022,476 A | 6/1991 | Weege | |
| 5,031,713 A | 7/1991 | Criscuolo | |
| 5,036,938 A | 8/1991 | Blount et al. | |
| 5,119,011 A * | 6/1992 | Lambert | 320/136 |
| 5,158,838 A * | 10/1992 | Bjordal et al. | 429/50 |
| 5,297,645 A | 3/1994 | Eckersley et al. | |
| 5,441,123 A | 8/1995 | Beckley | |
| 5,452,983 A | 9/1995 | Parmley, Sr. | |
| 5,520,258 A | 5/1996 | Kemshall | |
| 5,549,443 A | 8/1996 | Hammerslag | |
| 5,585,205 A | 12/1996 | Kohchi | |
| 5,711,648 A | 1/1998 | Hammerslag | |
| 5,927,938 A | 7/1999 | Hammerslag | |
| 5,934,053 A | 8/1999 | Fillman et al. | |
| 5,983,612 A | 11/1999 | Bauswell et al. | |
| 6,016,047 A * | 1/2000 | Notten et al. | 320/137 |
| 6,105,706 A | 8/2000 | Cooper | |
| 6,112,612 A | 9/2000 | Seksaria et al. | |
| 6,125,971 A | 10/2000 | Niebuhr et al. | |
| 6,189,636 B1 | 2/2001 | Kikukawa | |
| 6,231,067 B1 | 5/2001 | Johnson et al. | |
| 6,331,762 B1 * | 12/2001 | Bertness | 320/134 |
| 6,345,677 B1 | 2/2002 | Eckersley et al. | |
| 6,474,429 B1 | 11/2002 | Nishio | |
| 6,556,020 B1 * | 4/2003 | McCabe et al. | 324/426 |
| 6,633,165 B2 * | 10/2003 | Bertness | 324/426 |
| 6,637,807 B2 | 10/2003 | Gotz | |
| 7,070,225 B2 | 7/2006 | Herrmann | |
| 7,258,184 B2 | 8/2007 | Shorney et al. | |
| 2001/0013437 A1 | 8/2001 | Husted et al. | |
| 2002/0134599 A1 | 9/2002 | Magens et al. | |
| 2004/0173408 A1 | 9/2004 | Szymanski et al. | |
| 2005/0008465 A1 | 1/2005 | Szymanski et al. | |
| 2005/0036861 A1 | 2/2005 | Buchmann et al. | |
| 2005/0092536 A1 | 5/2005 | Takeda | |
| 2005/0255377 A1 | 11/2005 | Kondo | |
| 2005/0278920 A1 | 12/2005 | Bogelein | |
| 2006/0043914 A1 * | 3/2006 | Langlotz | 318/139 |
| 2006/0055373 A1 * | 3/2006 | Bopp et al. | 320/132 |

FOREIGN PATENT DOCUMENTS

| | | |
|---|---|---|
| DE | 4219786 A1 | 12/1993 |
| DE | 10005285 A1 | 8/2000 |
| EP | 1351068 A3 | 10/2003 |
| EP | 1688754 A2 | 8/2006 |
| GB | 772537 | 4/1957 |
| GB | 803068 | 10/1958 |
| GB | 1001535 | 8/1965 |
| GB | 1179141 | 1/1970 |
| GB | 2046676 | 11/1980 |
| GB | 2065066 | 6/1981 |
| GB | 2091179 | 7/1982 |
| JP | 62-218224 | 9/1987 |
| JP | 3109130 | 5/1991 |
| JP | 3109131 | 5/1991 |
| JP | 5105160 | 4/1993 |
| JP | 2000258513 | 9/2000 |
| JP | 200265191 | 9/2003 |
| JP | 3543662 B2 | 7/2004 |
| WO | WO 94/13508 | 6/1994 |

* cited by examiner

INDUSTRIAL TRUCK WITH A BATTERY AND METHOD FOR OPERATING AN INDUSTRIAL TRUCK WITH A BATTERY

CROSS REFERENCE TO RELATED APPLICATION

This application claims priority to German Application No. 10 2006 017 889.0, filed Apr. 13, 2006, which application is herein incorporated by reference in its entirety.

BACKGROUND OF THE INVENTION

1. Field of the Invention

The invention relates to an industrial truck with at least one battery. The invention likewise relates to a method for operating an industrial truck with at least one battery.

2. Technical Considerations

Such industrial trucks are used for the in-house transportation of goods, preferably when using electrical traction and lifting drives where it is necessary to avoid damaging exhaust gas emissions, in particular in internal spaces. In comparison with vehicles driven by an internal combustion engine, however, reduced use times need to be accepted since recharging or replacement of the battery is substantially more complex and more time-intensive than a tank-filling operation. For this reason, frequent charging or replacement operations should be avoided, which can be achieved in particular by optimized utilization of the energy supply stored in the battery. One of the preconditions for this is knowledge of the present state of charge of the battery which is as precise as possible since, when the available charge is underestimated, charging operations which are too frequent occur, while, when the state of charge is overestimated, the vehicle may fail unexpectedly, which means a substantially more serious restriction of the use time and, owing to the deep discharge, results in a shortened life of the battery.

In order to determine the energy supply stored in the battery, various methods are known. One of these consists in determining the state of charge by measuring the open terminal voltage of the battery. These two variables are approximately proportional to one another when the battery is off load. When an industrial truck is operated, however, various factors occur which may result in a falsification of the result: since, on load, the battery voltage is reduced, the energy content available is underestimated in the case of a state-of-charge display based on the voltage, which results in an unnecessarily premature charging operation.

A further problem in all methods which are based on voltage measurements is the occurrence of the so-called diffusion overvoltage, in which, owing to the loading of the battery, a concentration gradient occurs in the electrolyte, which results in a reduction in the terminal voltage. This phenomenon occurs particularly markedly in the case of the lead-acid batteries usually used in industrial trucks. As a diffusion-controlled process, the level of the diffusion overvoltage changes in the event of a change in the power drawn with a considerable time delay, with the result that, in the case of state-of-charge displays which are based on the measured terminal voltage, the display of the state of charge lags behind the actual available capacity. If this is not taken into account, the energy supply on load is overestimated and this may result in a damaging deep discharge of the battery. When there is no load, the distribution is brought back to normal again after a certain rest time, and the full capacity is available again. A simple state-of-charge display based on the battery voltage is therefore associated with many uncertainties and is therefore only suitable in certain circumstances for use in an industrial truck.

Greater accuracy in terms of the energy supply stored in the battery is obtained with methods in which, owing to the determination of the incoming or outgoing currents and integration of these measured values, the charge content of the battery is determined. In the event of a battery replacement, as is often carried out in practice in the case of industrial trucks, since the time required for this is substantially shorter than that required for charging the battery, however, the amount of usable charge contained in the new battery is not known. This disadvantage can be circumvented in part by battery data being stored on the battery or in a control device, but this is relatively complex.

Methods are also known which carry out both current and voltage measurements in order to determine the state of charge of the battery. For example, the capacity of the battery when inserted into the vehicle is determined from the measured open-circuit voltage and, when power is drawn, by integrating the measured current the drawn charge and therefore also the remaining residual capacity are determined. It is also known from U.S. Pat. No. 4,333,149 to calculate a so-called dynamic internal resistance, which has a relationship with respect to the state of charge, from the voltage drop when the battery is on load and from the drawn current. However, this method requires precise knowledge on the battery and does not take sufficient account of many boundary conditions, such as line losses between electrodes and measuring devices, for example. In order to obtain such knowledge, lengthy learning phases are required for each battery. In the case of an industrial truck which is often operated with replaceable batteries, this complex adaptation also needs to be carried out for each battery, and the apparatus needs to be operated with the respectively appropriate battery parameters. In the case of these methods, too, owing to the dependence on the measured voltage values, the occurrence of the diffusion overvoltage may result in a falsification of the information on the state of charge.

The methods or apparatuses known for industrial trucks with at least one battery in accordance with the known art for calculating and displaying the electrical energy which can be drawn from the battery are therefore either very complex or only produce unreliable results, which either systematically over- or underestimate the true state, depending on the method, or else deviate unpredictably depending on the discharge conditions.

Disadvantageous factors here, in particular in addition to the complex design, are the slow response to the severely fluctuating operating conditions of an industrial truck and the associated influences on the available battery capacity as well as the necessity to determine precise information on the battery used using complex methods. That is to say, if incorrect battery parameters are used, in most methods this may result in serious erroneous estimations of the state of charge with the known negative consequences.

SUMMARY OF THE INVENTION

It is an object of the invention to provide an industrial truck with at least one battery in which the residual capacity of the battery available in different operating and loading conditions can be detected in a reliable manner with little complexity for control tasks and/or for display to the operator.

Furthermore, it is object of the invention to provide a method for operating an industrial truck with at least one battery, with which method the residual capacity of the battery available in different operating and loading conditions can be detected in a reliable manner with little complexity for control tasks and/or for display to the operator. This object is achieved with respect to the industrial truck by virtue of the fact that the apparatus for determining the state of charge of the battery comprises means for determining the dynamic internal resistance and means for determining the internal cell voltage of the battery with the aid of the dynamic internal resistance. In this case, the internal cell voltage is considered to be the potential difference between the terminals in a battery. The internal cell voltage is a good measure of the state of charge of the battery, but differs considerably from the voltage present at the terminals of the cell, which voltage can be measured directly. The dynamic internal resistance can likewise be used as a parameter for calculating the state of charge, whereby the present determining methods in which the dynamic internal resistance is calculated from the quotient between the difference between the open terminal voltage of the battery in the rest state and the voltage on load and the current drawn likewise result in battery-dependent errors, which in particular result from the line resistances not being taken into account. By the internal cell voltage being determined with the aid of the dynamic internal resistance, a very precise method for determining this voltage is provided. In comparison with methods in accordance with the known art which only use the voltage measured at the terminals for determining the internal cell voltage and correct this voltage on the basis of estimations and assumptions on the battery, a substantially improved degree of accuracy is therefore achieved.

Regarding the method, the object is achieved by virtue of the fact that the internal cell voltage of the battery is determined with the aid of the dynamic internal resistance of the battery, and the state of charge of the battery is determined from the internal cell voltage of the battery.

The other dependent claims describe advantageous embodiments of the invention.

Further advantages and details of the invention will be explained in more detail below with reference to the exemplary embodiment illustrated in the drawings. Identical parts have been identified by the same reference symbols.

DESCRIPTION OF THE PREFERRED EMBODIMENTS

Figure 1:
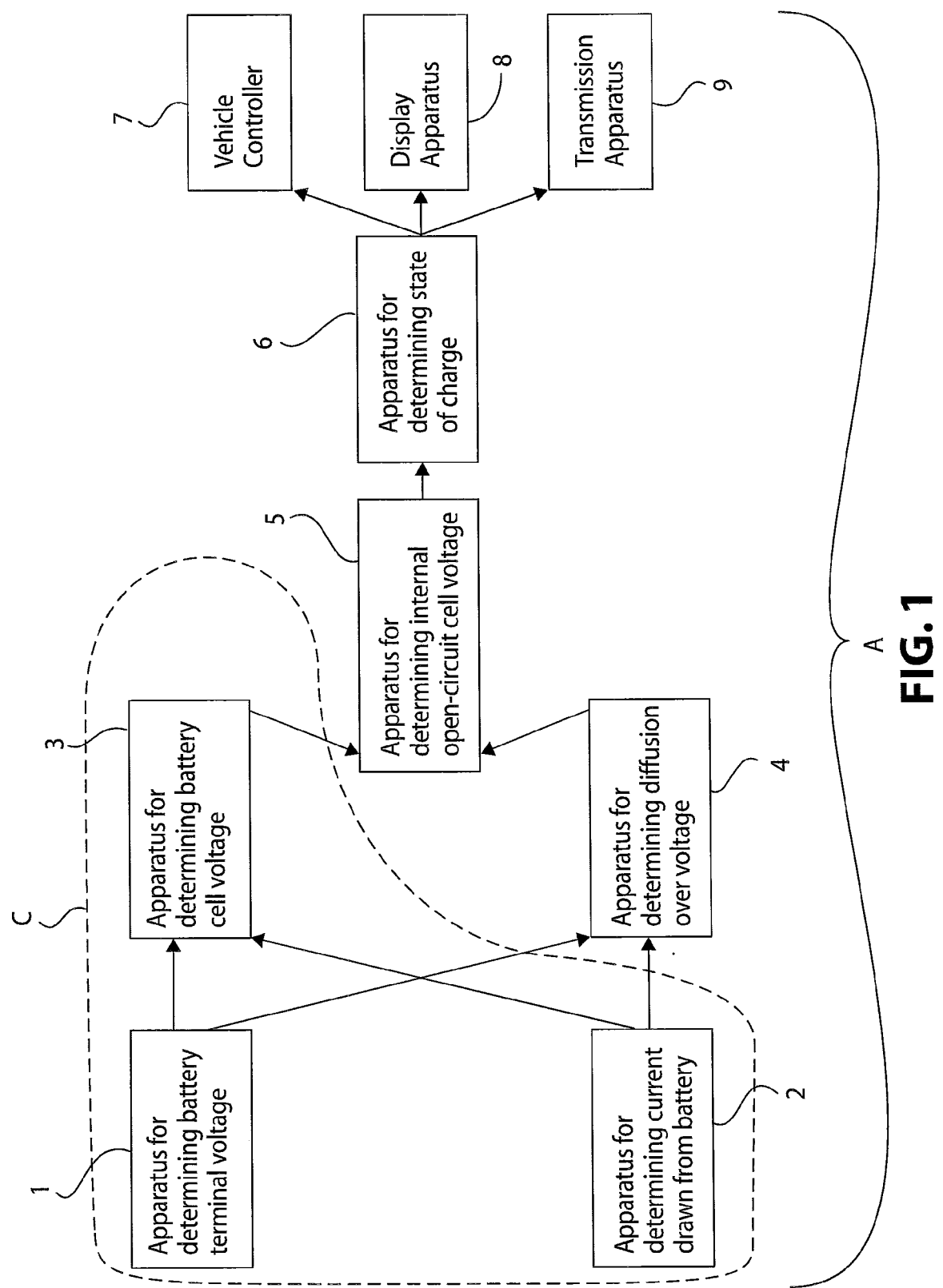
FIG. 1 shows a schematic illustration of an apparatus according to the invention for determining the state of charge of the battery of an industrial truck according to the invention.

FIG. 1 is a schematic illustration of an apparatus A according to the invention for determining the state of charge of the battery of an industrial truck according to the invention to illustrate the sequence of a method according to the invention. The apparatus A for determining the state of charge of the battery comprises means B (see FIG. 2) for determining the dynamic internal resistance and means C for determining the internal cell voltage of the battery with the aid of the dynamic internal resistance.

In the apparatus (1) for determining the battery terminal voltage, the voltage U present at the battery of the industrial truck is determined and divided by the number of cells n provided in the battery (which results from the vehicle-specific rated voltage), and thus the voltage value u is determined which is present on average at each battery cell. However, this division can also take place in principle at another point in the processing chain of the data, if this is necessary or expedient, for example for reasons of computational accuracy. Such solutions can naturally be regarded as being equivalent.

In the apparatus (2) for determining the current drawn from the battery (not illustrated here), the total current drawn from the battery is detected.

The apparatuses (1, 2) for determining the values for the voltage u and the current i may be in the form of conventional measuring devices for this purpose in accordance with the known art or else, in particular in the case of the current, in the form of calculation apparatuses, which calculate the values from other data, such as are detected, for example, in the vehicle controller.

In an apparatus (3) for determining the battery cell voltage, the internal cell voltage of the battery is determined from the current and voltage values i, u, while, parallel to this, in an apparatus (4) for determining the diffusion overvoltage, the value for the diffusion overvoltage, which counteracts the cell voltage owing to a concentration gradient in the electrolyte, is likewise determined from the current and voltage values i, u. The manner in which the apparatus (3) for determining the battery cell voltage functions is explained in more detail further below with reference to FIG. 2.

The diffusion overvoltage is in opposition to the battery cell voltage and, as the battery-specific variable, is essentially dependent on the power drawn, the geometry of the battery and the composition of the electrolyte. The apparatus (4) for determining the diffusion overvoltage calculates the level of the diffusion overvoltage using empirically determined average values from the input variables which make calculation of the power drawn possible. The adjustment is selected such that overcompensation is avoided which would result in ageing effects owing to the incorrectly calculated battery capacity. The apparatus (4) for determining the diffusion overvoltage in the present exemplary embodiment comprises an attenuator, which calculates the level of the diffusion overvoltage as a function of the power drawn, and a low-pass filter with a PT1 response, which reproduces the time delay between the withdrawal of power and the change in the diffusion overvoltage. The relationship between the withdrawal of power and the diffusion overvoltage is in this case produced in the form of an empirically determined equation in the attenuator, but a value assignment controlled by families of characteristics is also conceivable.

In the apparatus (5) for determining the internal open-circuit cell voltage, the (opposite) values for the internal cell voltage and the diffusion overvoltage are added to one another and thus the internal cell voltage of the battery in the rest state, i.e. with no load, is determined. This characteristic variable is directly related to the state of charge of the battery, which is determined in the apparatus (6) for determining the state of charge. The relationship between the internal open-circuit cell voltage and the state of charge is stored in the apparatus (6) in the form of an equation for calculating the state of charge from the internal open-circuit cell voltage, but embodiments are also conceivable in which a value assignment controlled by families of characteristics is carried out. In the apparatus (6) for determining the state of charge, the time profile of the internal open-circuit cell voltage is also analyzed. If this changes within a predetermined time interval more severely than a predetermined limit value (i.e. if a kink in the curve which represents the internal open-circuit cell voltage over time is established), this indicates the beginning of a damaging deep discharge.

The value for the state of charge in the industrial truck illustrated is represented in a suitable display apparatus (8), with the result that the operator is always informed of the residual capacity available. The display is in the form of a percentage display of full battery capacity, but other embodiments in accordance with the known art are also conceivable, such as audible indications or a display of the residual running time, for example. Furthermore, a vehicle controller (7) is also connected to the apparatus (6) for determining the state of charge, which vehicle controller controls the power of individual loads as a function of the state of charge of the battery in order to ensure that the energy of the battery is used optimally and safety-relevant functions remain functional even when there is a low state of charge. The transmission of the battery state of charge to further devices within or outside of the industrial truck is possible via a transmission apparatus (9), for example by means of a radio link to a central control point, which coordinates the use of various industrial trucks. If the onset of a deep discharge is established in the apparatus (6) for determining the state of charge, a corresponding signal is output to the connected units (7, 8, 9) and suitable measures are introduced there in order to avoid further discharge, i.e. for example a warning indication is output to the operator, the vehicle is brought to a standstill or a central control point is informed of the threat of failure of the vehicle.

Figure 2:
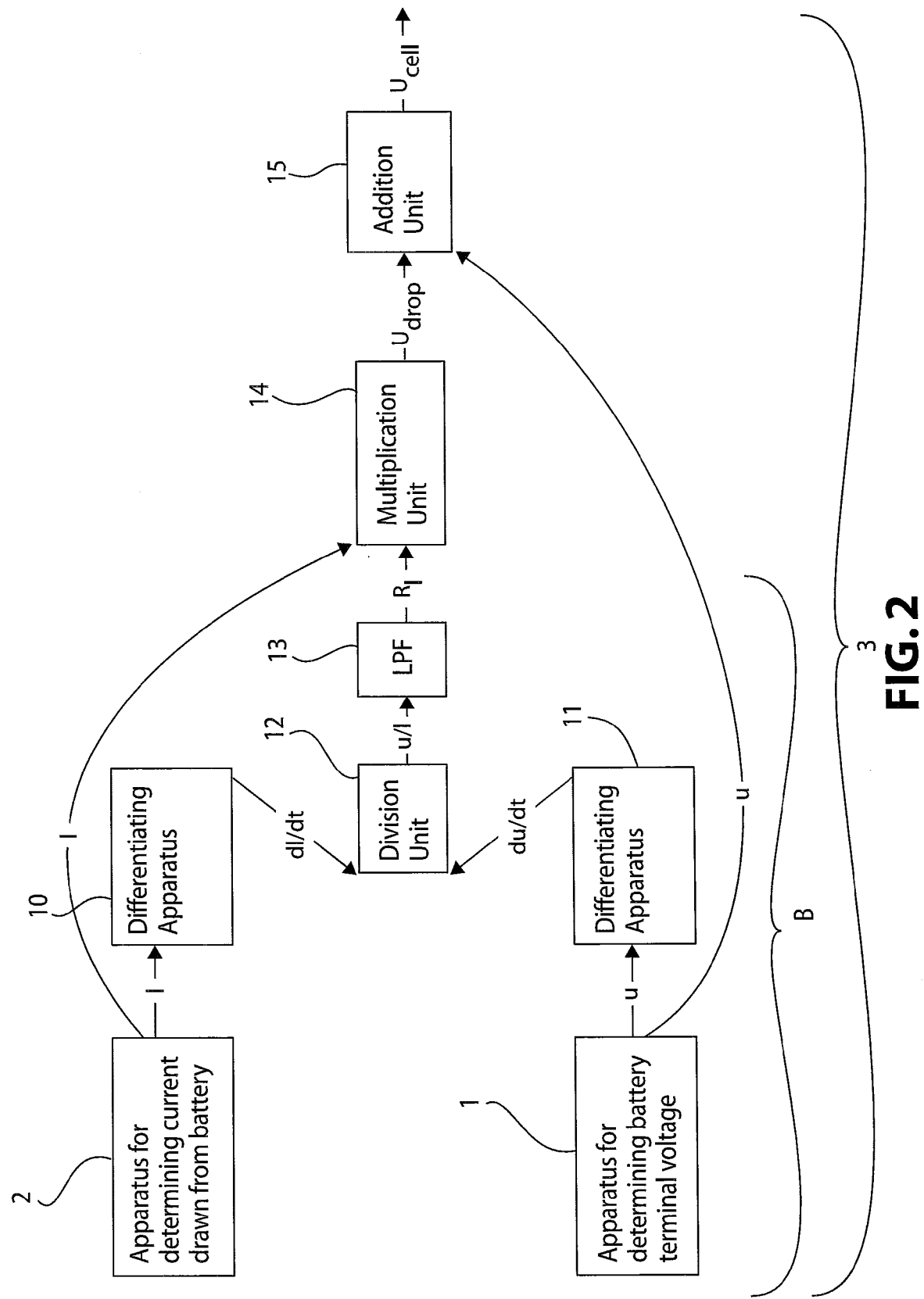
FIG. 2 shows a schematic of the design of an apparatus (3) for determining the battery cell voltage as part of an apparatus according to the invention for determining the state of charge of the battery of an industrial truck according to the invention.

FIG. 2 illustrates a schematic of the design of an apparatus (3) for determining the battery cell voltage as part of an apparatus according to the invention for determining the state of charge of the battery of an industrial truck according to the invention. This configuration is used to illustrate the method according to the invention for operating an industrial truck.

The apparatus (3) for determining the battery cell voltage comprises two differentiating apparatuses (10, 11), a division unit (12), a low-pass filter (13), a multiplication unit (14) and an addition unit (15).

In a first step, the current i is differentiated over time in the differentiating apparatus (10) and the voltage u is differentiated over time in the second differentiating apparatus (11), and thus the change in these variables is determined as a function of time. In the differentiating apparatus (12), the quotient of the values di/dt and du/dt determined in the differentiating apparatuses (10, 11) is formed. This value represents the dynamic internal resistance $R_i(t)$ of the battery and the lines connected to it. In contrast to methods in accordance with the known art which calculate the internal resistance only from the quotient between the difference between the open terminal voltage of the battery in the rest state and the voltage on load and the current drawn, a more precise value is therefore achieved. The low-pass filter (13) stabilizes the value of $R_i(t)$. The stabilized value of $R_i(t)$ is multiplied in the multiplication unit (14) by the current i, and thus the voltage dip $U_{drop}$ which takes place owing to the dynamic loading is determined. In the addition unit (15), the voltage dip $U_{drop}$ is added to the terminal voltage of the individual cell u and thus the internal cell voltage $U_{cell}$ is determined, which is then further-processed in the above-described manner in the apparatus (5) for determining the internal open-circuit cell voltage.

The apparatuses may be in the form of independent components or integrated in a single circuit. Furthermore, complete or partial integration into the circuits of a vehicle controller is conceivable, as is implementation of the calculation processes of the individual components in a computer. The apparatus according to the invention and the method according to the invention are particularly suited for application in industrial trucks in which a lead-acid battery is used as the traction battery, in particular owing to the compensation for the diffusion overvoltage, which occurs to a particularly pronounced extent in such batteries. However, in principle an application is also possible when using other batteries, such as nickel metal hydride, lithium ion or lithium ion polymer batteries.

Since, with the exception of the information on the diffusion overvoltage, no further battery parameters need to be known, complex battery data storage systems or learning phases for adapting to the type of battery used are not required. In the case of altered conditions, for example intermediate charging on a charging device or owing to energy recovery during operation, the arrangement shown responds more quickly to the changes than apparatuses in accordance with the prior art. Owing to the short response time, for example, deep discharges are prevented which arise if the state of charge display indicates a value which is too high and the industrial truck is therefore operated for longer than appropriate for the actual state of charge.

What is claimed is:

1. An industrial truck, comprising:
   at least one drive battery; and
   at least one apparatus for determining a state of charge of the battery, wherein the apparatus for determining the state of charge of the battery comprises means for determining a dynamic internal resistance and means for determining an internal cell voltage of the battery with the aid of the dynamic internal resistance,
   wherein the apparatus for determining the state of charge of the battery further comprises means for compensating for a diffusion overvoltage, and
   wherein the means for compensating for a diffusion overvoltage comprises:
   an attenuator, which calculates a level of the diffusion overvoltage as a function of power drawn, and
   a low-pass filter, which reproduces a time delay between a withdrawal of power and a change in the diffusion overvoltage.

2. The industrial truck according to claim 1, wherein the means for determining the internal cell voltage and the means for determining the dynamic internal resistance comprise at least one apparatus for determining a terminal voltage of the battery and at least one apparatus for determining a current drawn from the battery.

3. The industrial truck according to claim 1, wherein the means for determining the dynamic internal resistance comprise at least one apparatus for determining a time profile of a change in the terminal voltage of the battery and/or in the current drawn from the battery.

4. The industrial truck according to claim 2, wherein the means for determining the dynamic internal resistance comprise at least one apparatus for determining a time profile of a change in the terminal voltage of the battery and/or in the current drawn from the battery.

5. The industrial truck according to claim 1, further comprising means for detecting a threat of a deep discharge from the time profile of the internal open-circuit cell voltage are provided.

6. The industrial truck according to claim 2, further comprising means for detecting a threat of a deep discharge from the time profile of the internal open-circuit cell voltage are provided.

7. The industrial truck according to claim 3, further comprising means for detecting a threat of a deep discharge from the time profile of the internal open-circuit cell voltage are provided.

8. The industrial truck according to claim 4, further comprising means for detecting a threat of a deep discharge from the time profile of the internal open-circuit cell voltage are provided.

9. A method for operating an industrial truck, comprising:
determining an internal cell voltage of a battery with the aid of a dynamic internal resistance of the battery, and
determining a state of charge of the battery from the internal cell voltage of the battery,
wherein an internal open-circuit cell voltage is calculated from the addition of an internal cell terminal voltage and a diffusion overvoltage, and
wherein the diffusion overvoltage is determined by an apparatus for determining the diffusion overvoltage comprising:
an attenuator, which calculates a level of the diffusion overvoltage as a function of power drawn, and
a low-pass filter, which reproduces a time delay between a withdrawal of power and a change in the diffusion overvoltage.

10. The method for operating an industrial truck according to claim 9, wherein the dynamic battery internal resistance is determined from a time profile of a terminal voltage of the battery and of current drawn from the battery.

11. The method for operating an industrial truck according to claim 9, wherein the dynamic internal resistance is determined from a quotient of a time derivative of a terminal voltage of the battery and of a current drawn from the battery.

12. The method for operating an industrial truck according to claim 10, wherein the dynamic internal resistance is determined from a quotient of a time derivative of a terminal voltage of the battery and of a current drawn from the battery.

13. A method for operating an industrial truck according to claim 9, wherein the internal cell voltage is determined on the basis of multiplication of a current drawn from the battery and a dynamic internal resistance.

14. A method for operating an industrial truck according to claim 10, wherein the internal cell voltage is determined on the basis of multiplication of a current drawn from the battery and a dynamic internal resistance.

15. A method for operating an industrial truck according to claim 11, wherein the internal cell voltage is determined on the basis of multiplication of a current drawn from the battery and a dynamic internal resistance.

16. The method for operating an industrial truck according to claim 9, wherein the state of charge is determined from an internal open-circuit cell voltage.

* * * * *